(12) United States Patent
Kusuda

(10) Patent No.: US 6,843,202 B2
(45) Date of Patent: Jan. 18, 2005

(54) THERMAL PROCESSING APPARATUS FOR SUBSTRATE EMPLOYING PHOTOIRRADIATION

(75) Inventor: Tatsufumi Kusuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/621,429

(22) Filed: Jul. 17, 2003

(65) Prior Publication Data

US 2004/0018751 A1 Jan. 29, 2004

(30) Foreign Application Priority Data

Jul. 19, 2002 (JP) ................................. P2002-210886

(51) Int. Cl.[7] .............................................. C23C 16/00
(52) U.S. Cl. .................. 118/733; 118/722; 118/724; 118/725; 356/43; 356/44; 356/45; 356/46; 356/47; 356/48
(58) Field of Search ............................ 356/43, 44, 45, 356/46, 47, 48, 722; 118/724, 725, 733; 438/7, 16

(56) References Cited

U.S. PATENT DOCUMENTS

| | | |
|---|---|---|
| 4,525,380 A | 6/1985 | Arai et al. |
| 4,567,352 A | 1/1986 | Mimura et al. |
| 4,958,061 A | 9/1990 | Wakabayashi et al. |
| 6,630,991 B2 * | 10/2003 | Kitamura et al. .............. 356/43 |

FOREIGN PATENT DOCUMENTS

| | | |
|---|---|---|
| JP | 59-169125 | 9/1984 |
| JP | 63-166219 | 7/1988 |
| JP | 02-005294 | 2/1990 |
| JP | 02-077119 | 3/1990 |

OTHER PUBLICATIONS

English translation of portion of Japanese Patent Application Laid–Open No. 63–166219 relevant to the instant application.

* cited by examiner

Primary Examiner—David Nelms
Assistant Examiner—Renee R. Berry
(74) Attorney, Agent, or Firm—Ostrolenk, Faber, Gerb & Soffen, LLP

(57) ABSTRACT

A lamp house storing a plurality of flash lamps and a chamber storing and holding a semiconductor wafer are fitted to each other in an openable/closable manner. The lamp house and the chamber are fixed to a closed state with male screws. In order to process a semiconductor wafer, a shutter plate is drawn out to open an irradiation window. In this state, the shutter plate shields a space located above the male screws so that the male screws cannot be detached for opening the lamp house and the chamber. In order to open the lamp house and the chamber, the shutter plate must be inserted for shielding the irradiation window while opening the space located above the male screws. Thus, a thermal processing apparatus capable of preventing the lamps from breaking during maintenance thereof is provided.

10 Claims, 6 Drawing Sheets

F I G . 3
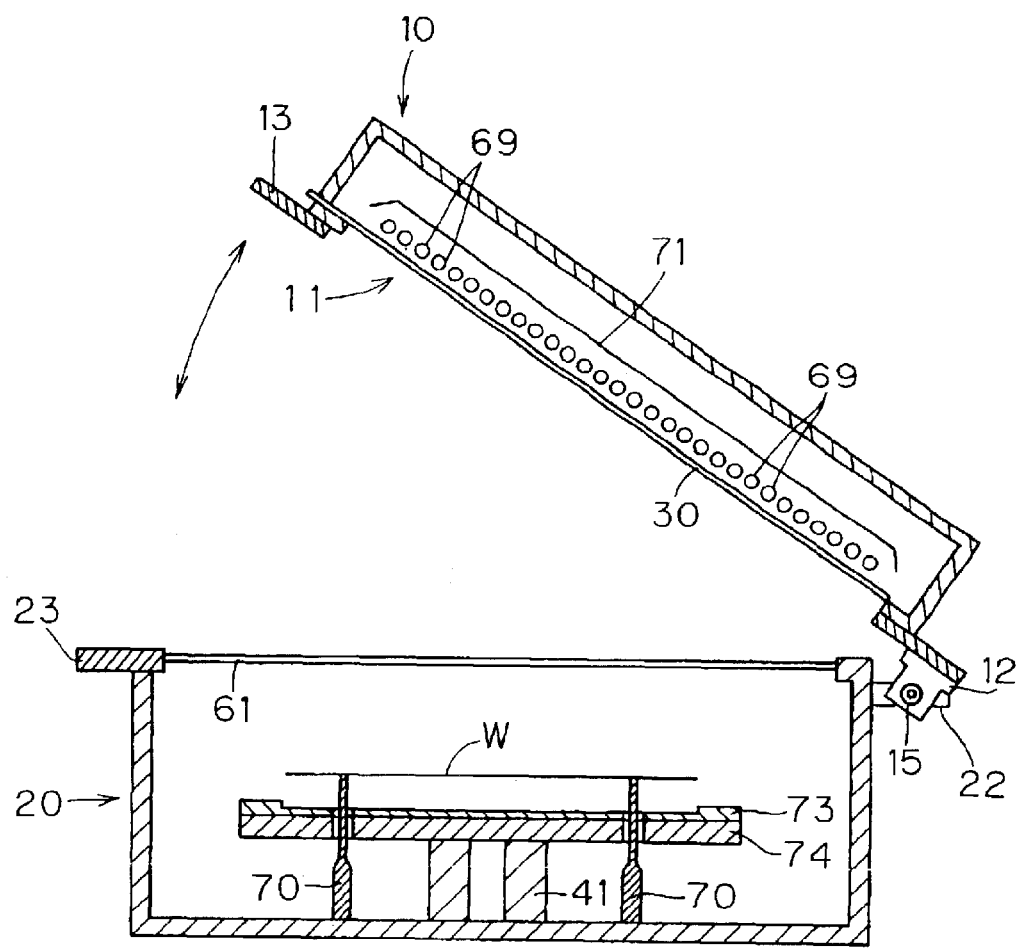

F I G . 6
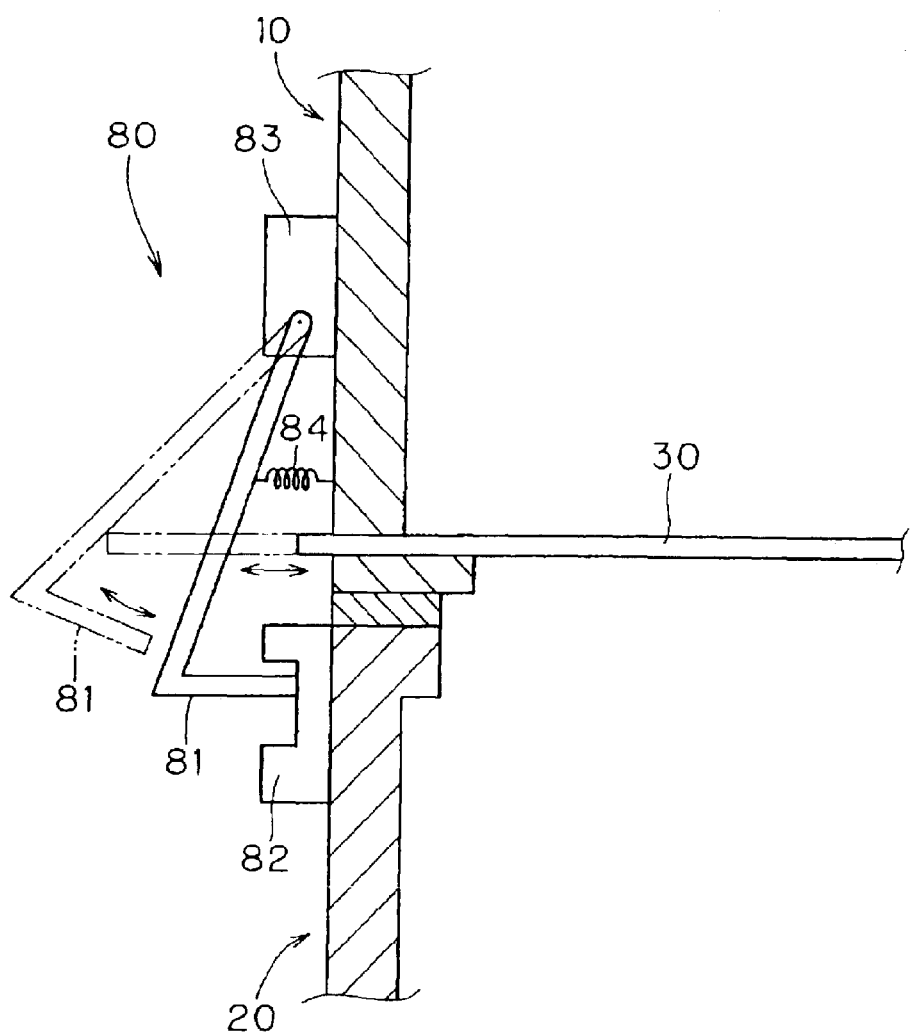

THERMAL PROCESSING APPARATUS FOR SUBSTRATE EMPLOYING PHOTOIRRADIATION

BACKGROUND OF THE INVENTION

1. Field of the Invention

The present invention relates to a thermal processing apparatus for thermally processing a semiconductor wafer or a glass substrate (hereinafter simply referred to as "substrate") by irradiating the same with light.

2. Description of the Background Art

In general, a thermal processing apparatus such as a lamp annealing apparatus using a halogen lamp is employed in an ion activation step for an ion-implanted semiconductor wafer. This thermal processing apparatus heats (anneals) the semiconductor wafer to a temperature of about 1000° C. to 1100° C., for example, thereby carrying out the ion activation step for the semiconductor wafer. This thermal processing apparatus increases the temperature of the substrate at a rate of about hundreds of degrees per second through the energy of light emitted from the halogen lamp.

However, it has been proved that the profile of ions implanted into the semiconductor wafer is rounded, i.e., the ions are thermally diffused when the ion activation step is carried out with the thermal processing apparatus heating the substrate at the rate of about hundreds of degrees per second. If this phenomenon takes place, the ions implanted into the surface of the semiconductor wafer are diffused also when the same are implanted in high concentration. Therefore, the ions must disadvantageously be implanted beyond necessity.

In order to solve the aforementioned problem, there is proposed a technique of irradiating the surface of a semiconductor wafer with flash light through xenon flash lamps or the like thereby increasing the temperature of only the surface of the ion-implanted semiconductor wafer in an extremely short time of not more than several milliseconds. When heating the semiconductor wafer with the xenon flash lamps for an extremely short time, the ions are not diffused due to a shortage of time and hence only the ion activation step can be carried out without rounding the profile of the ions implanted into the semiconductor wafer.

Such a thermal processing apparatus using xenon flash lamps is generally formed by fitting a lamp house comprising the xenon flash lamps and a chamber storing and holding the semiconductor wafer to each other in an openable/closable manner through a hinge. The aforementioned fitted structure is closed when the thermal processing apparatus flash-heats the semiconductor wafer, and opened when the apparatus is subjected to maintenance.

In general, however, an operator may carelessly come into contact with any of the xenon flash lamps provided in the lamp house to break this lamp during maintenance of the apparatus. The xenon flash lamps are high-priced, and much time is disadvantageously required not only for exchanging the lamp but also for re-adjusting the overall lamp house if any of the xenon flash lamps is broken.

SUMMARY OF THE INVENTION

The present invention is directed to a thermal processing apparatus heating a substrate by irradiating the substrate with light.

According to the present invention, the thermal processing apparatus comprises a chamber, comprising a chamber window transmitting light on its upper portion, for storing and holding a substrate therein, a lamp house, storing a lamp and comprising an irradiation window passing light emitted from the lamp therethrough on its lower portion, fitted to the chamber in an openable/closable manner and a locking mechanism fixing the chamber and the lamp house to a closed state for opposing the chamber window and the irradiation window to each other, for shielding the irradiation window by inserting a shielding plate in the closed state thereby releasing the locking mechanism and allowing opening of the chamber and the lamp house.

The chamber and the lamp house cannot be opened unless the irradiation window is shielded with the shielding plate and it follows that the shielding plate necessarily shields the irradiation window during opening, so that the lamp can be prevented from breaking during maintenance of the apparatus.

According to an aspect of the present invention, the thermal processing apparatus comprises a chamber, comprising a chamber window transmitting light on its upper portion, for storing and holding a substrate therein, a lamp house, storing a lamp and comprising an irradiation window passing light emitted from the lamp therethrough on its lower portion, fitted to the chamber in an openable/closable manner and a locking mechanism fixing the chamber and the lamp house to a closed state for opposing the chamber window and the irradiation window to each other, for covering the locking mechanism with a shielding plate drawn out in the closed state while shielding the irradiation window by inserting the shielding plate thereby allowing release of the locking mechanism and enabling opening of the chamber and the lamp house.

The chamber and the lamp house cannot be opened unless the irradiation window is shielded with the shielding plate for releasing the locking mechanism and it follows that the shielding plate necessarily shields the irradiation window during opening, so that the lamp can be prevented from breaking during maintenance of the apparatus.

Accordingly, an object of the present invention is to provide a thermal processing apparatus capable of preventing a lamp from breaking during maintenance of the apparatus.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a side sectional view showing the thermal processing apparatus in an open state;

FIG. 6 is an enlarged view of a locking mechanism provided in the thermal processing apparatus according to the second embodiment.

DESCRIPTION OF THE PREFERRED EMBODIMENTS

Embodiments of the present invention are now described with reference to the drawings.

<1. First Embodiment>

Figure 1:
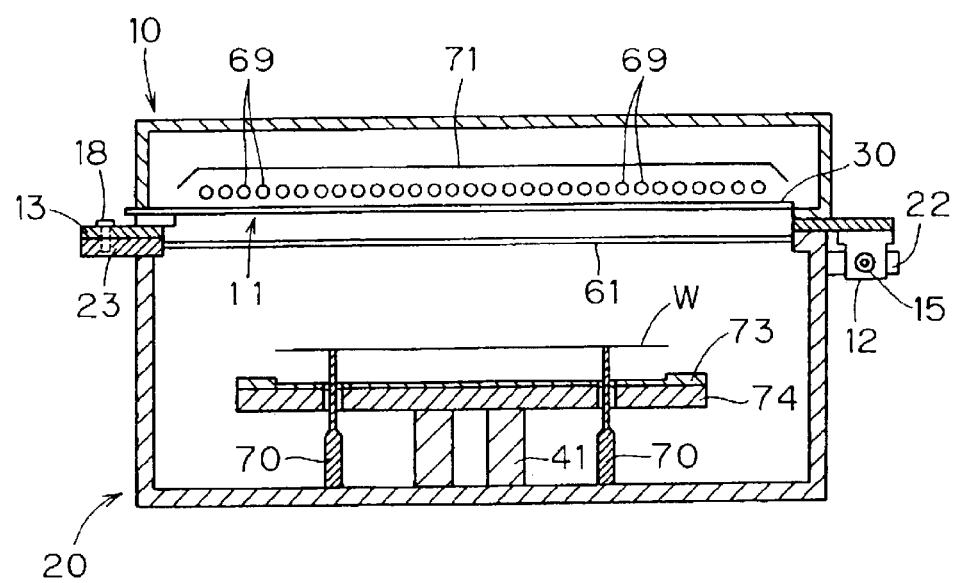
FIGS. 1 and 2 are side sectional views schematically showing the structure of a thermal processing apparatus according to a first embodiment of the present invention.
Figure 2:
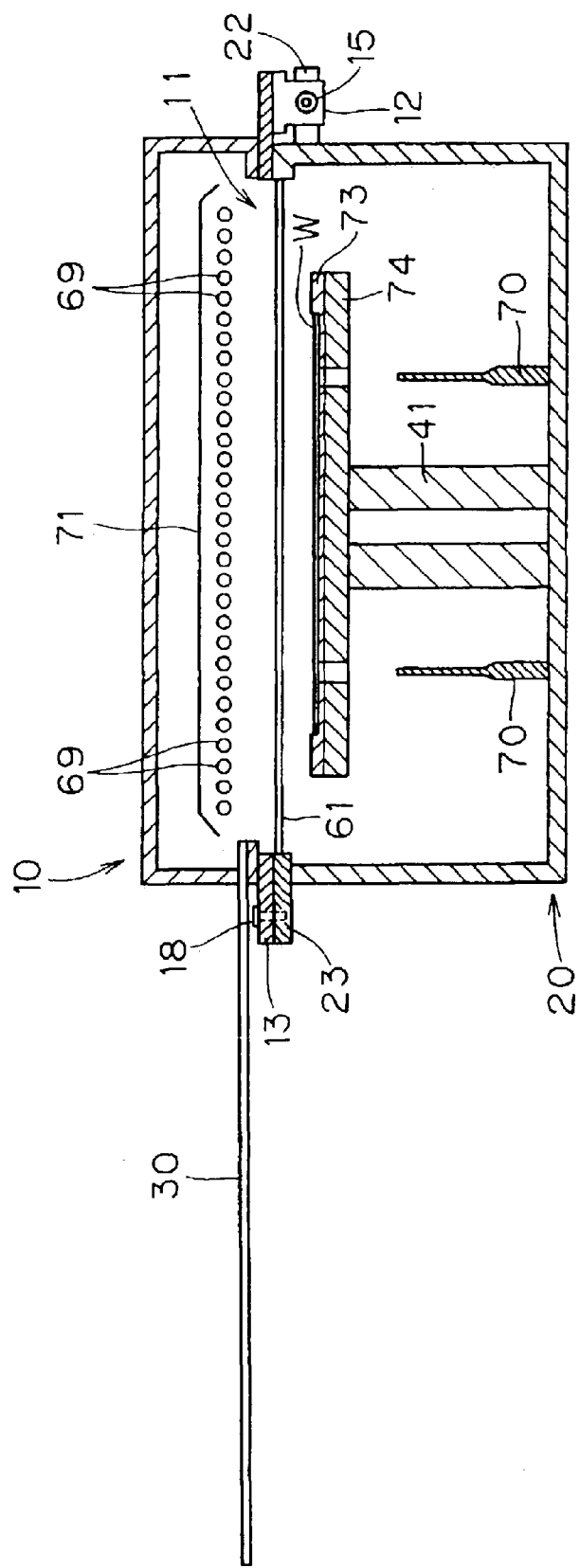

FIGS. 1 and 2 are side elevational views schematically showing the structure of a thermal processing apparatus according to a first embodiment of the present invention. This thermal processing apparatus thermally processes a substrate such as a semiconductor wafer W with flash light emitted from xenon flash lamps 69. The thermal processing apparatus is mainly formed by an upper lamp house 10 and a lower chamber 20.

The chamber 20 is employed for storing and holding the semiconductor wafer W in its housing when thermally processing the same. A translucent plate 61 forming the upper portion of the chamber 20 is made of an infrared-transparent material such as quartz, for example, for serving as a chamber window transmitting light emitted from the lamp house 10 and guiding the same into the chamber 20. Support pins 70 passing through a thermal diffusion plate 73 and a heating plate 74 described later for supporting the semiconductor wafer W from below are uprightly provided on the bottom of the chamber 20.

The thermal diffusion plate 73 and the heating plate 74 are arranged in the housing of the chamber 20. The thermal diffusion plate 73 is stuck to the upper surface of the heating plate 74. The heating plate 74 is employed for preheating (assist-heating) the semiconductor wafer W. This heating plate 74 is made of aluminum nitride, and stores a heater and a sensor for controlling the heater therein. On the other hand, the thermal diffusion plate 73 is employed for diffusing thermal energy received from the heating plate 74 and uniformly preheating the semiconductor wafer W. This thermal diffusion plate 73 is made of a material such as sapphire ($Al_2O_3$: aluminum oxide) or quartz having relatively small thermal conductivity.

A motor (not shown) drives the thermal diffusion plate 73 and the heating plate 74 for vertically moving the same between a position for introducing/discharging the semiconductor wafer W into/from the chamber 20 shown in FIG. 1 and a thermal processing position for the semiconductor wafer W shown in FIG. 2. A cylindrical body 41 supporting the heating plate 74 is interlocked/coupled with the aforementioned motor and driven by the motor to be vertically movable between the position for introducing/discharging the semiconductor wafer W into/from the chamber 20 shown in FIG. 1 and the thermal processing position for the semiconductor wafer W shown in FIG. 2.

The thermal diffusion plate 73 and the heating plate 74 are moved down to the position for introducing/discharging the semiconductor wafer W into/from the chamber 20 shown in FIG. 1 so that the thermal processing apparatus can place the semiconductor wafer W introduced into the chamber 20 through a port (not shown) provided on a side wall of the chamber 20 by a transport robot (not shown) on the support pins 70 or discharge the semiconductor wafer W placed on the support pins 70 from the chamber 20 through the port. In this state, the upper ends of the support pins 70 pass through through-holes formed in the thermal diffusion plate 73 and the heating plate 74 to project upward beyond the surface of the thermal diffusion plate 73.

On the other hand, the thermal diffusion plate 73 and the heating plate 74 are moved up to the thermal processing position for the semiconductor wafer W beyond the upper ends of the support pins 70 in order to thermally process the semiconductor wafer W. In the process of upwardly moving the thermal diffusion plate 73 and the heating plate 74 from the position for introducing/discharging the semiconductor wafer W shown in FIG. 1 to the thermal processing position shown in FIG. 2, the thermal diffusion plate 73 receives the semiconductor wafer W placed on the support pins 70, supports the lower surface thereof on its surface, moves up and horizontally holds the semiconductor wafer W on a position in the chamber 20 approximate to the translucent plate 61. In the process of downwardly moving the thermal diffusion plate 73 and the heating plate 74 from the thermal processing position to the position for introducing/discharging the semiconductor wafer W, on the other hand, the thermal diffusion plate 73 transfers the supported semiconductor wafer W to the support pins 70.

The chamber 20 is provided with a mechanism sealing the internal atmosphere, an inert gas supply mechanism supplying nitrogen gas or the like, an exhaust mechanism and the like in addition to the aforementioned structure.

The lamp house 10 comprises a plurality of (30 in this embodiment) xenon flash lamps (hereinafter also simply referred to as "flash lamps") 69 and a reflector 71 in its housing. The plurality of flash lamps 69, which are bar lamps having elongated cylindrical shapes respectively, are horizontally arranged in parallel with each other. The reflector 71 is arranged above the plurality of flash lamps 69 to entirely cover the flash lamps 69.

Each of the xenon flash lamps 69 comprises a glass tube filled with xenon gas and provided on both ends thereof with an anode and a cathode connected to a condenser and a trigger electrode wound on the outer periphery of the glass tube. The xenon gas is an electric insulator and hence no electricity flows in the glass tube in a general state. When a high voltage is applied to the trigger electrode for breaking down insulation, electricity stored-in the condenser instantaneously flows in the glass tube for heating the xenon gas with Joule heat and emitting light. The xenon flash lamps 69 can emit extremely strong light as compared with a continuum source since previously stored electrostatic energy is converted to an extremely short optical pulse of 0.1 ms to 10 ms.

The lower portion of the housing of the lamp house 10 is opened to define an irradiation window 11 passing light emitted from the flash lamps 69 therethrough. In the state shown in FIG. 2, part of the light emitted from the flash lamps 69 is directly transmitted through the irradiation window 111 and the translucent plate 61 and introduced into the chamber 20. The remaining part of the light emitted from the flash lamp 69 is temporarily reflected by the reflector 71, transmitted through the irradiation window 11 and the translucent plate 61 and introduced into the chamber 20. The irradiation window 11 may be provided with a quartz glass member or a diffusion plate.

The lamp house 10 is fitted to the chamber 20 in an openable/closable manner using a hinge mechanism. In other words, the lamp house 10 and the chamber 20 are formed as separate members, and bearings 22 and 12 fixed to the chamber 20 and the lamp house 10 respectively are rotatably fitted with each other through a rotation shaft 15. Thus, the thermal processing apparatus can switch the lamp house 10 and the chamber 20 between the open state shown in FIG. 3 and the closed state for opposing the translucent plate 61 and the illumination window 11 to each other as shown in FIG. 1.

On the other hand, projections 13 and 23 are fixed to positions of the lamp house 10 and the chamber 20 opposite to the bearings 12 and 22 respectively. The projections 13 and 23 are provided with screw holes. Each of the projections 13 and 23 may be provided with about three screw holes, for example.

When the lamp house 10 and the chamber 20 are closed, the projections 13 and 23 come into contact with each other. Male screws 18 are fitted in the screw holes of the projections 13 and 23 in this closed state thereby fastening the projections 13 and 23 to each other and screwing the lamp house 10 and the chamber 20 to each other. When screwed in such a manner, the lamp house 10 and the chamber 20 cannot be opened as a matter of course, and it follows that the lamp house 10 and the chamber 20 are fixed to the closed state as shown in FIGS. 1 and 2. In other words, the thermal processing apparatus according to this embodiment employs the fastening mechanism screwing the lamp house 10 and the chamber 20 to each other as a locking mechanism fixing the lamp house 10 and the chamber 20 to the closed state for opposing the translucent plate 61 and the irradiation window 11 to each other.

When the male screws 18 are detached from the projections 13 and 23, on the other hand, the lamp house 10 and the chamber 20, which are fixed to each other in the openable/closable manner, can be opened as shown in FIG. 3.

Figure 4:
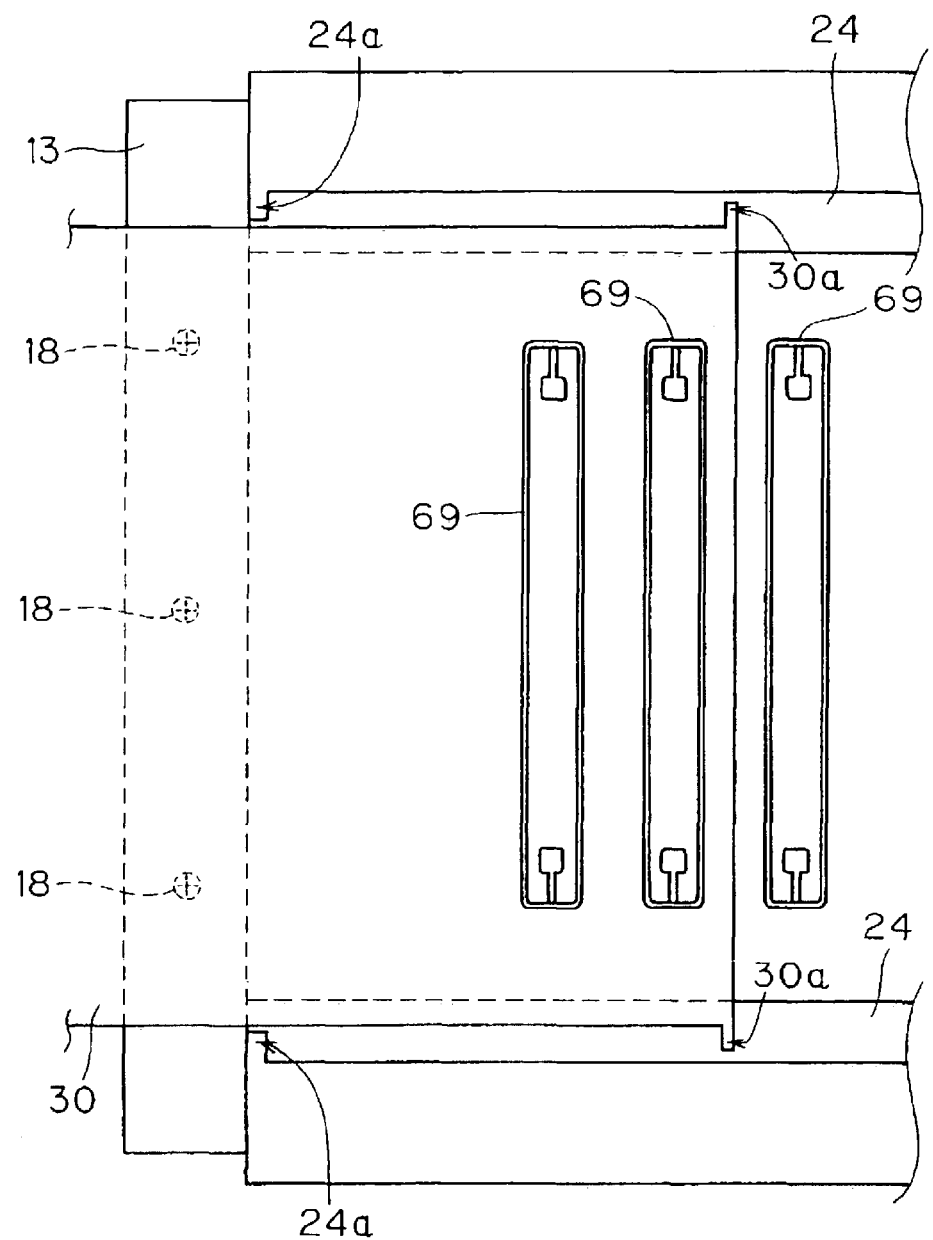
FIG. 4 a top plan view partially showing a lamp house.

The thermal processing apparatus according to this embodiment is provided with a shutter plate (shielding plate) 30 in the form of a substantially rectangular flat plate. The shutter plate 30, mounted on the lamp house 10, is rendered slidable between a shielding position shown in FIG. 1 and a processing position shown in FIG. 2. FIG. 4 is a top plan view partially showing the lamp house 10. Two grooves 24 are horizontally arranged in parallel with each other on the inner surfaces of side walls of the housing of the lamp house 10. The shutter plate 30 is slidably placed on the two grooves 24. Therefore, the shutter plate 30 is slidable along the two grooves 24. However, stop members 30a and 24a project from the forward ends of both sides of the shutter plate 30 and outlet-side ends of the grooves 24 respectively. Even if an operator slides the shutter plate 30 to draw out the same from the lamp house 10, therefore, the stop members 24a and 30a engage with each other so that the shutter plate 30 cannot be completely detached from the lamp house 10. In other words, the stop members 24a and 30a serve as a detachment inhibiting mechanism inhibiting detachment of the shutter plate 30 from the lamp house 10.

The shutter plate 30 is made of a material such as an aluminum alloy or stainless steel, for example, opaque with respect to the light emitted from the flash lamps 69. This shutter plate 30 has a planar size capable of at least entirely covering the irradiation window 11.

When the shutter plate 30 is drawn out from the lamp house 10 to the processing position shown in FIG. 2 in the closed state of screwing the lamp house 10 and the chamber 20 to each other, the irradiation window 11 is completely opened while the shutter plate 30 covers the heads of the male screws 18. In this state, the irradiation window 11 is so opened that the light emitted from the plurality of flash lamps 69 can be transmitted through the irradiation window 11 and the translucent plate 61 and introduced into the chamber 20. The shutter plate 30 shields the heads of the male screws 18 so that the male screws 18 cannot be detached from the projections 13 and 23. Thus, the lamp house 10 and the chamber 20 cannot be brought into the open state either, as a matter of course.

When the shutter plate 30 is inserted into the lamp house 10 up to the shielding position shown in FIG. 1 in the closed state screwing the lamp house 10 and the chamber 20 to each other, the shutter plate 30 completely shields the irradiation window 11 while the space located above the heads of the male screws 18 is opened. In this state, the shutter plate 30 completely shields the irradiation window 11 for shielding flash light emitted from the plurality of flash lamps 69, not to leak the same from the lamp house 10. Further, the space around the heads of the male screws 18 is so opened that the male screws 18 can be detached from the projections 13 and 23 for bringing the lamp house 10 and the chamber 20 into the open state shown in FIG. 3. In other words, the shutter plate 30 inserted into the lamp house 10 shields the irradiation window 11 thereby allowing release of the locking mechanism employing the fastening mechanism with the screws 18 for enabling opening of the chamber 20 and the lamp house 10.

An operation of the thermal processing apparatus according to this embodiment is now described. This thermal processing apparatus processes the semiconductor wafer W completely subjected to ion implantation.

In order to thermally process the semiconductor wafer W in the aforementioned thermal processing apparatus, an operator brings the lamp house 10 and the chamber 20 into the closed state shown in FIG. 1 and fastens the projections 13 and 23 to each other with the male screws 18. Thus, the lamp house 10 and the chamber 20 are fixed in the closed state for opposing the translucent plate 61 and the irradiation window 11 to each other. The operator draws out the shutter plate 30 from the lamp house 10 for providing a processible state shown in FIG. 2.

Thereafter the transport robot (not shown) introduces the semiconductor wafer W into the chamber 20 and places the same on the support pins 70 while the thermal diffusion plate 73 and the heating plate 74 are arranged on the position for introducing/discharging the semiconductor wafer W into/from the chamber 20 shown in FIG. 1. When the semiconductor wafer W is completely introduced into the chamber 20, the port of the chamber 20 is closed. Thereafter the thermal diffusion plate 73 and the heating plate 74 are moved up to the thermal processing position for the semiconductor wafer W shown in FIG. 2 for horizontally holding the semiconductor wafer W. Further, a jet of nitrogen gas is formed in the chamber 20.

The heater built in the heating plate 74 previously heats the thermal diffusion plate 73 and the heating plate 74 to a prescribed temperature. When the thermal processing apparatus moves up the diffusion plate 73 and the heating plate 74 to the thermal processing position for the semiconductor wafer W, therefore, the heated thermal diffusion plate 73 comes into contact with the semiconductor wafer W thereby preheating the same and gradually increasing the temperature of the semiconductor wafer W.

In this state, the thermal diffusion plate 73 continuously heats the semiconductor wafer W. When the thermal diffusion plate 73 increases the temperature of the semiconductor wafer W, a temperature sensor (not shown) regularly monitors whether or not the surface temperature of the semiconductor wafer W reaches a preheating temperature T1.

The preheating temperature T1 is about 200° C. to 600° C., for example. Also when the thermal diffusion plate 73 heats the semiconductor wafer W to this degree of preheating temperature T1, ions implanted into the semiconductor wafer W are not diffused.

When the surface of the semiconductor wafer W reaches the preheating temperature T1, the thermal processing apparatus lights the flash lamps 69 for performing flash heating. In this flash heating step, the thermal processing apparatus lights the flash lamps 69 for about 0.1 ms to 10 ms. Thus, it follows that the flash lamps 69 converting previously stored electrostatic energy to such extremely short optical pulses emit extremely strong flash light.

The surface of the semiconductor wafer W instantaneously reaches a temperature T2 due to such flash heating. The temperature T2 of about 1000° C. to 1100° C. is necessary for ion activation of the semiconductor wafer W. The thermal processing apparatus increases the temperature of the surface of the semiconductor wafer W to the level of this processing temperature T2 thereby activating the ions implanted into the semiconductor wafer W.

At this time, the thermal processing apparatus increases the temperature of the surface of the semiconductor wafer W to the level of the processing temperature T2 in the extremely short time of about 0.1 ms to 10 ms, thereby completing the ion activation step for the semiconductor wafer W in a short time. Therefore, the ions implanted into the semiconductor wafer W are not diffused but the thermal processing apparatus can prevent the profile of the ions implanted into the semiconductor wafer W from rounding. The time necessary for the ion activation step is extremely short as compared with the time necessary for diffusion of the ions and hence the thermal processing apparatus completes the ion activation step in the short time of about 0.1 ms to 10 ms causing no diffusion.

Further, the thermal processing apparatus heating the surface of the semiconductor wafer W to the preheating temperature T1 of about 200° C. to 600° C. with the heating plate 74 before lighting the flash lamps 69 for heating the semiconductor wafer W can quickly increase the temperature of the semiconductor wafer W to the level of the processing temperature T2 of about 1000° C. to 1100° C. with the flash lamps 69.

After completing the flash heating step, the thermal diffusion plate 73 and the heating plate 74 are moved down to the position for introducing/discharging the semiconductor wafer W into/from the chamber 20 shown in FIG. 1 while the thermal processing apparatus opens the port of the chamber 20. The transport robot (not shown) discharges the semiconductor wafer W placed on the support pins 70 from the chamber 20. Thus, the thermal processing apparatus completes the thermal processing operation.

In order to maintain this thermal processing apparatus, the operator inserts the shutter plate 30 into the lamp house 10 for attaining the shielding state shown in FIG. 1. In this state, the shutter plate 30 completely shields the irradiation window 11. At the same time, the shutter plate 30 covering the space located above the heads of the male screws 18 is inserted into the lamp house 10 to open this space, whereby the male screws 18 can be detached from the projections 13 and 23. The operator detaches the male screws 18 from the projections 13 and 23 and brings the lamp house 10 and the chamber 20 into the open state shown in FIG. 3. Then, the operator maintains the apparatus in this state.

Even if the operator tries to bring the lamp house 10 and the chamber 20 into the open state without inserting the shutter plate 30 into the lamp house 10, the male screws 18 whose heads are covered by the drawn shutter plate 30 cannot be detached from the projections 13 and 23. In other words, it is impossible to bring the lamp house 10 and the chamber 20 into the open state without inserting the shutter plate 30 into the lamp house 10. The shutter plate 30 inserted into the lamp house 10 shields the irradiation window 11 thereby opening the peripheral space of the locking mechanism using the fastening mechanism with the screws 18 and consequently allowing release of the locking mechanism and enabling opening of the chamber 20 and the lamp house 10.

When maintaining the apparatus in the state where the shutter plate 30 completely shields the irradiation window 11 as shown in FIG. 3, there is no apprehension that the operator carelessly comes into contact with any flash lamp 69 or the like in the lamp house 10 to break the same.

Even if the flash lamps 69 falsely emit light due to overvoltage, noise mixed into the trigger electrodes or static electricity, the light is not leaked from the lamp house 10 since the shutter plate 30 made of the material opaque to the light completely shields the irradiation window 11.

Further, the operator is prevented from carelessly touching the trigger electrodes or the like to which a high voltage is applied during maintenance.

<2. Second Embodiment>

Figure 5:
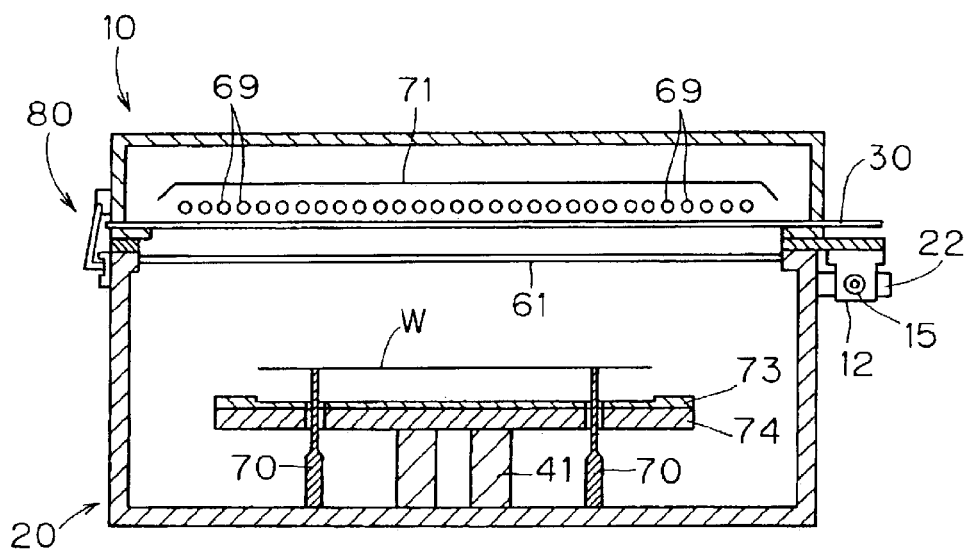
FIG. 5 is a side elevational view schematically showing the structure of a thermal processing apparatus according to a second embodiment of the present invention.

A thermal processing apparatus according to a second embodiment of the present invention is now described. FIG. 5 is a side sectional view schematically showing the structure of the thermal processing apparatus according to the second embodiment. The thermal processing apparatus according to the second embodiment also thermally processes a substrate such as a semiconductor wafer W with flash light emitted from xenon flash lamps 69. The thermal processing apparatus according to the second embodiment is different from that according to the first embodiment in a locking mechanism 80 for fixing a lamp house 10 and a chamber 20 to a closed state and a mode of releasing the locking mechanism 80 with a shutter plate 30. The remaining points of the thermal processing apparatus according to the second embodiment are identical to those of the thermal processing apparatus according to the first embodiment, and hence elements of the former identical to those of the latter are denoted by the same reference numerals to omit redundant description.

Also in the second embodiment, the lamp house 10 storing the plurality of flash lamps 69 and the chamber 20 storing and holding the semiconductor wafer W are fitted to each other in an openable/closable manner using a hinge mechanism. The thermal processing apparatus according to the second embodiment employs the locking mechanism 80 using a ratchet, in order to fix the lamp house 10 and the chamber 20 to the closed state. FIG. 6 is an enlarged view showing the locking mechanism 80 of the thermal processing apparatus according to the second embodiment. This locking mechanism 80 comprises a stopper 81, a stop member 82, a support member 83 and a spring 84. The support member 83 is fixed to a side of the lamp house 10 opposite to a bearing 12. The support member 83 rotatably supports the stopper 81 having a substantially L-shaped section. The spring 84 couples the stopper 81 with a wall surface of the lamp house 10. The stop member 82 is fixed to a side of the chamber 20 opposite to a bearing 22. The stop member 82 has a concave section.

In the thermal processing apparatus according to the second embodiment, it follows that a shutter plate 30 is inserted/discharged into/from the lamp house 10 oppositely to the thermal processing apparatus according to the first embodiment, i.e., from the side of a rotation shaft 15. The shutter plate 30 is made of a material opaque to the light emitted from the flash lamps 69 and has a planar size capable of at least entirely covering an irradiation window 11, identically to the first embodiment. Further, the shutter plate 30 is horizontally slidable along grooves provided on the lamp house 10, also identically to the first embodiment.

When the lamp house 10 and the chamber 20 are closed and the shutter plate 30 is drawn out from the lamp house 10, the irradiation window 11 is opened and the forward end of the stopper 81 engages with a concave portion of the stop member 82 as shown by solid liens in FIG. 6. In this state, the spring 84 presses the forward end of the stopper 81 to come into contact with the concave portion of the stop member 82. When the shutter plate 30 is drawn out from the lamp house 10, therefore, the lamp house 10 and the chamber 20 cannot be opened but are fixed to a closed state for opposing a translucent plate 61 and the irradiation window 11 to each other. The light emitted from the plurality of flash lamps 69 can be transmitted through the open irradiation window 11 and the translucent plate 61 and introduced into the chamber 20.

When the shutter plate 30 is introduced into the lamp house 10 so that the forward end thereof comes into contact with the stopper 81 and further pushed in the closed state of the lamp house 10 and the chamber 20, the stopper 81 pressed by the forward end of the shutter plate 30 rotates against elastic force of the spring 84 so that the forward end thereof separates from the concave portion of the stop member 82 as shown by two-dot chain lines in FIG. 6. In this state, it follows that the locking mechanism 80 is released to allow opening of the chamber 20 and the lamp house 10. It also follows that the shutter plate 30 completely shields the irradiation window 11 for blocking flash light emitted from the plurality of flash lamps 69, not to leak the same from the lamp house 10.

In order to process the semiconductor wafer W with the thermal processing apparatus according to the second embodiment, an operator closes the lamp house 10 and the chamber 20 and draws out the shutter plate 30 from the lamp house 10. Thus, the irradiation window 11 is opened and the stopper 81 engages with the concave portion of the stop member 82 due to the elastic force of the spring 84 to fix the lamp house 10 and the chamber 20 to the closed state. Thereafter the thermal processing apparatus thermally processes the semiconductor wafer W identically to that according to the first embodiment.

In order to maintain the thermal processing apparatus according to the second embodiment, the operator inserts the shutter plate 30 into the lamp house 10 for completely shielding the irradiation window 11 while pressing up the stopper 81 with the forward end of the shutter plate 30 thereby releasing the locking mechanism 80. Then, the operator brings the lamp house 10 and the chamber 20 into the open state and maintains the apparatus.

Even if the operator tries to bring the lamp house 10 and the chamber 20 into the open state without inserting the shutter plate 30 into the lamp house 10, the stopper 81 engages with the concave portion of the stop member 82 thereby fixing the lamp house 10 and the chamber 20 to the closed state when the shutter plate 30 is drawn out, whereby the lamp house 10 and the chamber 20 cannot be opened. In other words, it is impossible to bring the lamp house 10 and the chamber 20 into the open state without inserting the shutter plate 30 into the lamp house 10 also in the second embodiment. The shutter plate 30 inserted into the lamp house 10 shields the irradiation window 11 thereby releasing the locking mechanism 80 and consequently enabling opening of the chamber 20 and the lamp house 10.

When maintaining the apparatus in the state where the shutter plate 30 completely shields the irradiation window 11 also in the second embodiment, there is no apprehension that the operator carelessly comes into contact with any flash lamp 69 or the like in the lamp house 10 to break the same.

Even if the flash lamps 69 falsely emit light due to overvoltage, noise mixed into the trigger electrodes or static electricity, the light is not leaked from the lamp house 10 since the shutter plate 30 made of the material opaque to the light completely shields the irradiation window 11.

<3. Modifications>

While the embodiments of the present invention have been described, the present invention is not restricted to the aforementioned embodiments. For example, while each of the aforementioned embodiments employs the fastening mechanism employing a ratchet or a screw as the locking mechanism for fixing the lamp house 10 and the chamber 20 to the closed state for opposing the translucent plate 61 and the irradiation window 11 to each other, the present invention is not restricted to this but can employ any well-known fixing mechanism. This fixing mechanism may insert the shutter plate 30 into the lamp house 10 for shielding the irradiation window 11 thereby rendering opening of the chamber 20 and the lamp house 10 allowable.

The technique according to the present invention is also applicable to a thermal processing apparatus comprising another type of lamps such as halogen lamps, for example, in the lamp house 10 in place of the flash lamps 69 for heating the semiconductor wafer W with light emitted from these lamps.

While the thermal processing apparatus according to each of the aforementioned embodiments irradiates the semiconductor wafer W with light for performing ion activation, the substrate to be processed by the inventive thermal processing apparatus is not restricted to the semiconductor wafer W. For example, the thermal processing apparatus according to the present invention may alternatively process a glass substrate formed with any silicon film such as a silicon nitride film or a polycrystalline silicon film. For example, silicon is ion-implanted into a polycrystalline silicon film formed on a glass substrate by CVD for forming an amorphous silicon film, followed by formation of a silicon oxide film for serving as an anti-reflection coating thereon. In this state, the thermal processing apparatus according to the present invention can irradiate the overall surface of the amorphous silicon film with light for forming a polycrystalline silicon film by polycrystallizing the amorphous silicon film.

The thermal processing apparatus according to the present invention can irradiate a TFT substrate, having a structure obtained by forming an underlayer silicon oxide film and a polysilicon film prepared by crystallizing amorphous silicon on a glass substrate and doping the polysilicon film with an impurity such as phosphorus or boron, with light for activating the impurity implanted into the polysilicon film in the doping step.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus that heats a substrate by irradiating said substrate with light, comprising:
   a chamber for storing and holding said substrate, and including a chamber window that allows the passage of light into the chamber;
   a lamp house storing a lamp and comprising an irradiation window passing light emitted from said lamp therethrough, the lamp house being fitted to said chamber in an openable/closable manner;
   a locking mechanism that enables fixing said chamber and said lamp house to a closed state in which said chamber window and said irradiation window oppose each other; and a shielding plate insertable into the lamp house to shield said chamber window and to enable said locking mechanism to be operated to allow opening of said chamber and said lamp house.

2. The thermal processing apparatus according to claim 1, wherein said shielding plate is opaque with respect to said light emitted from said lamp.

3. The thermal processing apparatus according to claim 2, wherein said lamp is a xenon flash lamp.

4. A thermal processing apparatus that heats a substrate by irradiating said substrate with light, comprising:
- a chamber for storing and holding said substrate, and including a chamber window that allows the passage of light into the chamber;
- a lamp house storing a lamp and comprising an irradiation window passing light emitted from said lamp therethrough, the lamp house being fitted to said chamber in an openable/closable manner;
- a locking mechanism that enables fixing said chamber and said lamp house to a closed state in which said chamber window and said irradiation window oppose each other; and
- a shielding plate that is capable of blocking access to said locking mechanism and capable of being drawn out in said closed state while shielding said irradiation window by inserting said shielding plate into said lamp housing thereby allowing release of said locking mechanism and enabling opening of said chamber and said lamp house.

5. The thermal processing apparatus according to claim 4, wherein said shielding plate is opaque with respect to said light emitted from said lamp.

6. The thermal processing apparatus according to claim 5, wherein said lamp is a xenon flash lamp.

7. The thermal processing apparatus according to claim 1, wherein the locking mechanism comprises screws.

8. The thermal processing apparatus according to claim 1, including a hinge mechanism by which the chamber and the lamp house are mechanically coupled to one another.

9. The thermal processing apparatus according to claim 4, wherein the locking mechanism comprises screws.

10. The thermal processing apparatus according to claim 4, including a hinge mechanism by which the chamber and the lamp house are mechanically coupled to one another.

* * * * *